(12) United States Patent
Stampfl et al.

(10) Patent No.: US 6,242,163 B1
(45) Date of Patent: Jun. 5, 2001

(54) SHAPE DEPOSITION MANUFACTURING OF MICROSCOPIC CERAMIC AND METALLIC PARTS USING SILICON MOLDS

(75) Inventors: Jurgen Stampfl, Redwood City; Alexander Cooper, Lafayette; Rudolf Leitgeb; Yih-Lin Cheng, both of Mountain View; Friedrich Prinz, Woodside, all of CA (US)

(73) Assignee: Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/387,328

(22) Filed: Aug. 31, 1999

Related U.S. Application Data

(60) Provisional application No. 60/098,479, filed on Aug. 31, 1998.

(51) Int. Cl.⁷ .................... C23F 1/00; B29C 33/42
(52) U.S. Cl. ............... 430/322; 430/323; 205/70; 216/2; 216/33; 216/39; 264/219; 264/318
(58) Field of Search .................. 216/2, 33, 39; 205/70; 264/219, 318; 430/322, 323

(56) References Cited

U.S. PATENT DOCUMENTS

| | | | |
|---|---|---|---|
| 3,853,714 | * 12/1974 | Shimada et al. | 204/4 |
| 4,894,194 | * 1/1990 | Janney | 264/109 |
| 5,028,362 | * 7/1991 | Janney et al. | 264/25 |
| 5,378,583 | 1/1995 | Guckel et al. | 430/325 |
| 5,496,668 | 3/1996 | Guckel et al. | 430/9 |
| 5,645,977 | * 7/1997 | Wu et al. | 430/320 |

* cited by examiner

Primary Examiner—Thorl Chea
(74) Attorney, Agent, or Firm—Lumen Intellectual Property Services, Inc.

(57) ABSTRACT

Micro-Mold Shape Deposition Manufacturing ($\mu$-Mold SDM) is a method for fabricating complex, three-dimensional microstructures from layered silicon molds. Silicon wafers are etched using conventional silicon-processing techniques to produce wafers with surface patterns, some of which contain through-etched regions. The wafers are then stacked and bonded together to form a mold, which is filled with part material. In one embodiment, the part material is a ceramic or metallic gelcasting slurry that is poured into the mold and solidified to form a part precursor. The mold is removed, and the precursor is sintered to form the final part. The gelcasting material may also be a polymer or magnetic slurry, in which case sintering is not needed. The mold can also be filled by electroplating a metal into it; if necessary, each layer is filled with metal after being bonded to a previously filled layer. Patterned silicon wafer layers may also be combined with macroscopic wax layers formed by Mold SDM to create macroscopic parts with some microscopic parts or features.

25 Claims, 7 Drawing Sheets

SHAPE DEPOSITION MANUFACTURING OF MICROSCOPIC CERAMIC AND METALLIC PARTS USING SILICON MOLDS

CROSS-REFERENCE TO RELATED APPLICATIONS

This application is based on Provisional application 60/098,479 filed Aug. 31, 1998, which is herein incorporated by reference.

STATEMENT REGARDING FEDERALLY SPONSORED RESEARCH OR DEVELOPMENT

This invention was supported in part by grant number MIP-9618050 from the National Science Foundation (NSF) and by grant number F33615-95-C-5560-P00003 from the Defense Advanced Research Projects Agency (DARPA). The U.S. Government has certain rights in the invention.

FIELD OF THE INVENTION

This invention relates generally to micromachining methods. More particularly, it relates to a method for fabricating complex millimeter and sub-millimeter parts out of ceramic and metallic materials using layered molds.

BACKGROUND ART

A variety of methods are available for fabricating complex microscopic and mesoscopic parts out of ceramics and metals, in which feature or part sizes are below 1 millimeter. These sizes are not accessible by conventional machining techniques, including milling and turning. Micromachining techniques can be divided into a few main groups: thin film techniques, micro-stereolithography ($\mu$-SLA), photo-chemical etching, and LIGA.

Thin film techniques include etching, sputtering, and chemical vapor deposition. Material is deposited onto a silicon substrate, which is etched away after the part is formed. Complex multi-material assemblies can be produced with high accuracy. However, only certain materials can be deposited in sufficient quality with these techniques. Feature height is limited to about 10 $\mu$m, above which internal stresses built up during thin-film deposition cause delamination. In addition, microscopic parts formed by this technique cannot be combined with conventionally machined parts to form an assembly. A related technique involves electroplating into patterned silicon substrates. Generally, a thin seed layer is deposited onto the wafer as an electroplating base before electroplating. This technique also has height limitations, and complex structures with overhangs cannot be electroplated.

SLA is widely used for manufacturing macroscopic prototypes out of polymeric materials, and has been adapted for micropart fabrication, as described in T. Nakamoto et al., "Manufacturing of three-dimensional micro-parts by UV laser induced polymerisation," Journal of Micromechanics and Microengineering, Vol. 7, pp. 89–92 (1997). Parts are made by scanning a UV laser over a photo-curable resin. In regions where the laser penetrates the liquid surface, the resin solidifies and forms the part. SLA achieves complex three-dimensional structures, but accuracy is limited by the spot size of the laser and its penetration depth. It is also difficult to remove the uncured resin from microscopic cavities.

In photo-chemical etching, a focused laser beam removes material by photo-chemical ablation. This process has been used to shape silicon with an argon-ion laser in a chlorine atmosphere, and is described in T. M. Bloomstein and D. J. Ehrlich, "Laser deposition and etching of three-dimensional microstructures," IEEE, Transducers '91, pp. 507–511. Laser ablation allows the creation of real three-dimensional structures. Its main disadvantage is the slow speed of the process. Since surfaces must be scanned in a serial fashion, photo-chemical etching cannot compete with the highly parallel lithographic processes, especially when a large number of devices are manufactured or if large volumes of material must be removed.

LIGA (Lithographie, Galvanik, Abformung) involves the use of a bright X-ray beam to irradiate polymers such as polymethyl methacrylate (PMMA). The irradiated PMMA degenerates into shorter polymer chains that are soluble in certain solvents. By covering some regions Qf the polymer with an X-ray mask, microstructured polymer parts can be manufactured. LIGA can produce polymer microstructures with very high precision and high aspect ratios. By electroplating into the polymer mictrostructures, metal parts can be formed. However, standard LIGA cannot be used to produce complex, multi-layered parts.

A method for producing complex structures using PMMA sheets patterned by LIGA has been disclosed in U.S. Pat. Nos. 5,378,583 and 5,496,668, issued to Guckel et al. Multiple layers can be stacked to form complex microstructures of up to 1 mm in height. This method has some significant drawbacks, however. Both X-ray masks and access to the synchrotron light source needed for X-ray generation are extremely expensive. In fact, while the LIGA method is, in theory, capable of highly parallel manufacturing of numerous identical or different parts, incorporating an X-ray source into mass production is unfeasible. Furthermore, part material that can be cast or plated into polymer microstructures is quite limited. The mold must be able to withstand the filling process without heat- or pressure-induced deformation, and the part material must be unaffected by the method (usually chemical) used to remove the polymer. The thin, flexible polymer is also difficult to handle and align, with both the X-ray mask and subsequent layers. Polymer layers also cannot be combined with macroscopic layers to form macroscopic parts incorporating microscopic features.

There is still a need for a process for accurately fabricating complex, three-dimensional microstructures that can be used for mass production.

OBJECTS AND ADVANTAGES

Accordingly, it is a primary object of the present invention to provide a highly accurate method for fabricating complex, three-dimensional microscopic and mesoscopic parts. The parts can include overhangs and curved surfaces.

It is a further object of the invention to provide a method for fabricating parts up to 1 mm high.

It is an additional object of the invention to provide a method in which the finished part can easily be removed from its mold, without retaining any unwanted material.

It is another object of the present invention to provide a method that can produce large quantities of parts in parallel, in an economically viable fashion.

It is an additional object to provide a method for fabricating parts from a wide range of ceramic and metallic materials.

It is a further object to provide a method that uses a mold that is easy to form, handle, and align, and is made of rigid, strong material.

Finally, it is an object of the invention to provide a technique for fabricating macroscopic parts that that have regions or features of microscopic or mesoscopic dimensions.

SUMMARY

These objects and advantages are attained by Micro-Mold Shape Deposition Manufacturing, a method for shaping microscopic parts and assemblies out of ceramic and metallic materials using layered silicon molds. The molds are made using standard silicon-processing technologies, and then filled with the desired material. The mold is removed to obtain the final part.

In one embodiment, a method of fabricating a precursor to a part, "surface patterns are etched in a plurality of silicon wafer layers, " at least one of which contains a through-etched region. The wafers are stacked and bonded together to create a mold, which is then filled with a gelcasting material, which may be a ceramic, metallic, or other gelcasting slurry. The gelcasting material is then solidified to produce the precursor. The mold may also contain patterned wax layers, which have pattern features wider than 1 mm, so that the resulting precursor has both microscopic and macroscopic regions. The method may also include a first additional step of removing the precursor from the mold, preferably by chemically etching the silicon mold, and a second additional step of sintering the precursor to form the part.

This embodiment also includes the use of a mold containing only one layer. The layer is made by creating a surface pattern in a mold material; the surface pattern includes a feature of width between 1 $\mu$m and 1 mm. Preferably, the mold material is a silicon wafer, and the pattern is created by wet or dry etching; features may be up to 10 mm wide. The mold is then used as described above to create a precursor and a micropart.

Also provided is a method for fabricating parts made of a material that does not require sintering to form the finished part. A layered mold is formed as described above. In this case, the layered mold is filled with part material to produce the part. The mold can either be created from the wafer layers and then filled, or each wafer layer can be filled after it is stacked and bonded to the previously filled wafer layer. The mold may also be attached to a support surface before being filled. Part material may be a polymer, metal, metal powder, magnetic slurry, or other material. For a metal powder, the filling step also includes liquid-phase sintering. Preferably, the part material is a metal, in which case the mold is attached to a metal support surface and the metal is electroplated into the mold to create the part.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

Figure 1A:
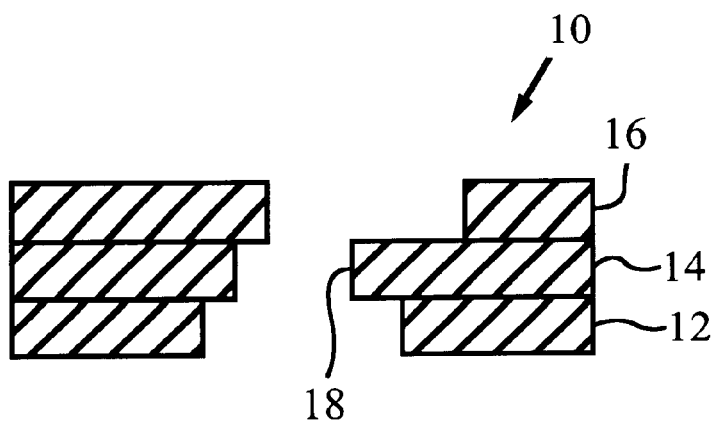
FIG. 1A is a cross-sectional view of a layered mold produced by the method of the present invention.
Figure 1B:
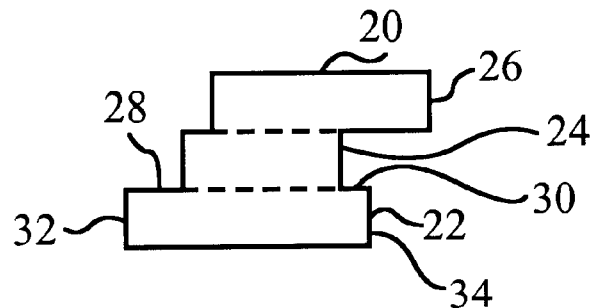
FIG. 1B is a cross-sectional view of a micropart produced in the mold of FIG. 1A.

The present invention, Micro-Mold Shape Deposition Manufacturing ($\mu$-Mold SDM), is a process for fabricating complex, three-dimensional parts out of ceramic and metallic materials using layered molds. FIG. 1A shows an example of a layered silicon mold 10, made from layers 12, 14, and 16. The individual layers are etched silicon wafers; in this example, all of the wafers are through-etched. FIG. 1B is a cross-sectional view of a part 20 that is formed in mold 10 of FIG. 1A. Part 20 contains three prismatic sections, 22, 24, and 26, shown separated by dotted lines. Prismatic sections 22, 24, and 26 correspond to mold layers 12, 14, and 16, respectively. A prismatic section has coplanar faces bound by sides perpendicular to the faces. For example, prismatic section 22 contains coplanar faces 28 and 30 bound by sides 32 and 34.

Multiple prismatic sections can be constructed in a single silicon wafer by repeated etchings using different photographic masks, as will be described below. However, it is not possible to create an overhang 18 without using the layered mold of the present invention. Micro-Mold SDM allows for fabrication of much more complex parts than can be produced by standard silicon-processing techniques.

Figure 2:
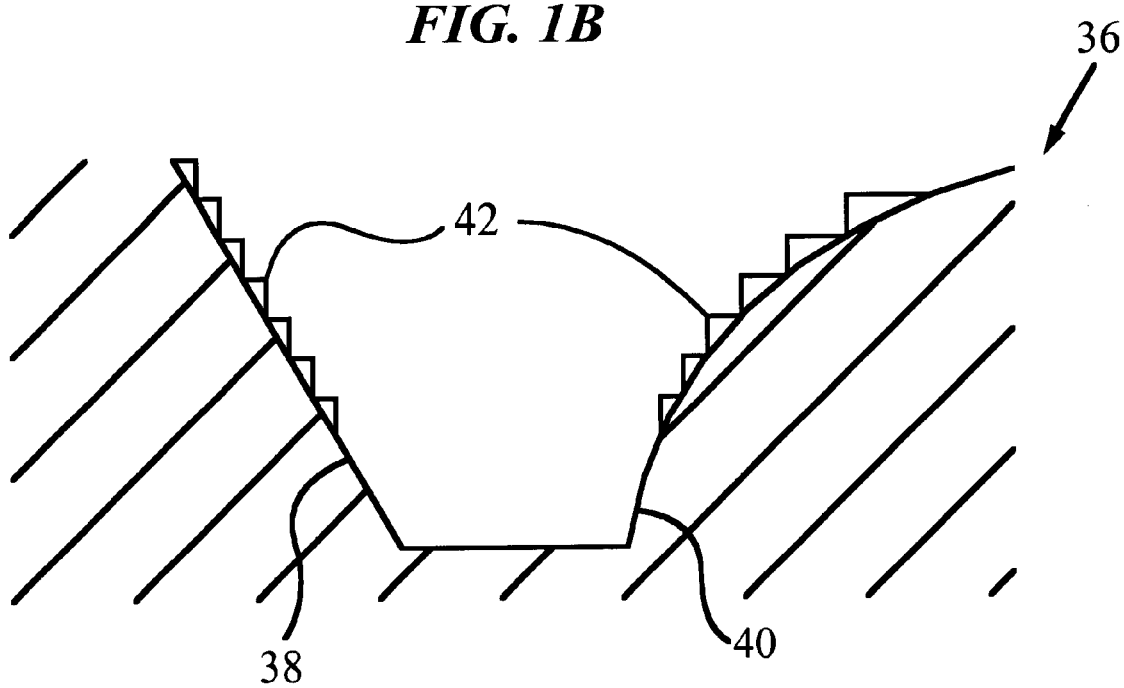
FIG. 2 is a cross-sectional CAD diagram of a mold with slanted and curved surfaces.

Adaptive process-planning software can be used to determine an appropriate set of prismatic mold layers from a computer-aided design (CAD) part model. For each prismatic section, a photographic mask for silicon processing is produced using the bottom face geometry of the layer. FIG. 2 shows a portion of a CAD model 36 containing a slanted surface 38 and a curved surface 40. If the model cannot be oriented in a way that allows division into prismatic sections, a stair-step approximation 42 to the required accuracy is used to obtain the prismatic sections.

Dividing a mold into layers of equal height is well known in the art. Algorithms describing stair-step approximations with varying layer heights have also recently been developed. These techniques minimize the number of steps or layers necessary to approximate a given geometry while satisfying particular accuracy specifications. Mathematical tools such as Fourier or Wavelet transformations are used to estimate how rapidly the part geometry changes in a given area, which determines how thick the layer must be.

After the layer thicknesses and patterns have been determined, silicon wafers are etched using conventional processes to create the surface patterns in the layers. The following description illustrates a preferred process; of course, any method that creates anisotropically through-etched wafers may be used.

Commercially-available wafers have thicknesses between 10 $\mu$m and 1 mm. If a wafer with the predetermined thickness is not available, a slightly thicker wafer can be chosen, and the thickness can be reduced by dry-etching in a deep reactive ion-etching machine, wet-etching with chemical agents, mechanically polishing, or any other suitable technique.

Figure 3:
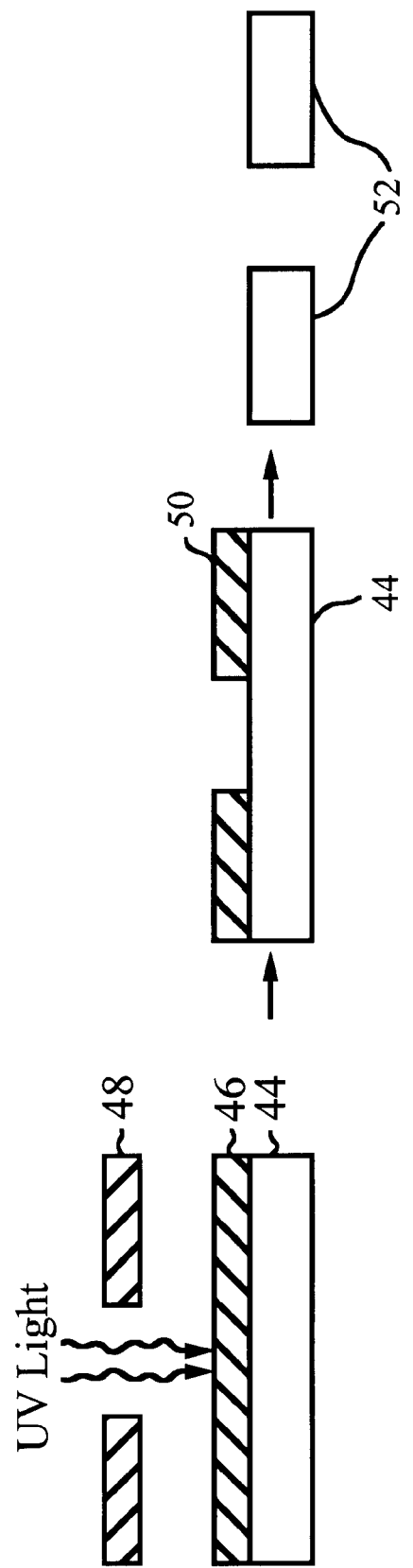
FIG. 3 is a schematic diagram of a process for etching a surface pattern in a silicon wafer.

FIG. 3 illustrates the silicon-processing step. A wafer 44 is coated with a layer of photoresist 46, preferably by spin coating. Photoresist 46 is preferably between 1 and 15 $\mu$m thick. Wafer 44 is mounted in a commercial mask aligner (not shown) and exposed to ultraviolet (UV) light through a photographic mask 48 containing the necessary patterns for the layer being produced. UV light changes the molecular structure of photoresist 46 in the exposed regions. Negative photoresist hardens after exposure and is resistant to solvents capable of dissolving unexposed photoresist. Positive photoresist breaks down when exposed to UV light and is easily removed with solvents that cannot dissolve unexposed positive photoresist; regions are chemically dissolved using a solvent known as a "developer", leaving a pattern of hardened photoresist 50 on wafer 44. This pattern resists subsequent wet or dry etching, whereas the exposed surface of wafer 44 does not. Photoresist 46 is a positive photoresist, but negative photoresist may also be used with appropriate photographic masks.

Wafer 44 with photoresist layer 50 is then etched to create a patterned wafer 52 containing features in the areas not covered by layer 50. A feature is any discrete section of a pattern, such as a trough or edge. Features are preferably between 1 $\mu$m and 1 mm in width, but may be up to 10 mm. In order to attain prismatic sections and high accuracy of part geometry, the etching must be anisotropic: wafer material is etched vertically, but not laterally. No significant underetching of photoresist 50 can occur. Because through-etched regions of several hundred micrometers are produced, high etch rates are also required. Both requirements can be met by a commercially-available deep reactive ion-etching machine, which can etch at a rate of up to 4 $\mu$m/min.

When {100} silicon wafers are used, anisotropic etching can also by performed by wet etching using chemical etchants. These wafers have a particular, unidirectional crystal orientation. Possible etchants include, but are not limited to, potassium hydroxide (KOH) and tetra-methyl ammonium hydroxide (TMAH). Of course, any other method for producing anisotropically etched wafers may be used.

Etching also removes some amount of photoresist. For example, dry etching of silicon wafers to a depth of 70 $\mu$m etches about 1 $\mu$m of photoresist, and the photoresist thickness must be chosen accordingly. Photoresist remaining after etching may be removed by, for example, acetone or a 4:1 volume mixture of sulfuric acid and hydrogen peroxide, to reveal patterned wafer 52.

The entire etching process is repeated as many times as necessary. If the wafer has only one prismatic section, no further silicon processing steps are required. The process must be performed for each required layer. "Closed" molds may have a bottom layer that does not require etching.

Figure 4A:
FIGS. 4A–4C are cross-sectional diagrams of a layered mold being formed.
Figure 4B:
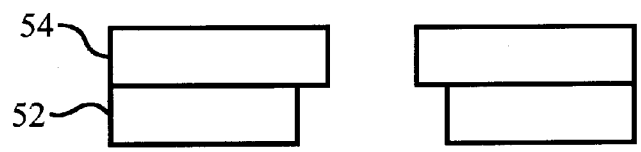
Figure 4C:
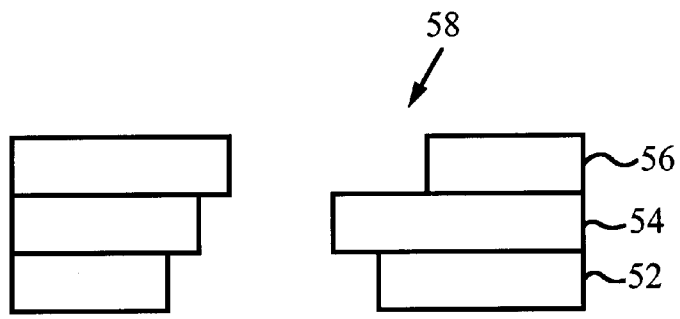

The wafers are then aligned with each other for stacking. FIGS. 4A–4C show wafer 52 of FIG. 3 being aligned with subsequent wafer layers 54 and 56. Alignment may be done using mechanical alignment marks that were etched into the silicon or using an optical microscope. Using these methods, wafers may be aligned to a precision of 1 $\mu$m; that is, edges or alignment marks are at most 1 $\mu$m apart. Of course, any method may be used to align the wafers. It is relatively easy to align the wafers because of their high strength and rigidity.

Wafers 52, 54, and 56 are laminated together to produce a mold 58, preferably by applying an adhesive on the side surfaces of the layers or by bonding the layers in a commercial wafer bonder. If one photographic mask contains patterns for several layers, the wafer is cut into pieces after being etched, and the patterned pieces are stacked to form the mold. A single mold can also be used to form many of the same parts or many different parts. This allows the method to be used in highly parallel manufacturing processes.

Next, the mold is filled with part material. One method of filling the mold is gelcasting, a relatively new method for fabricating macroscopic ceramic parts. Compared with traditional ceramics, gelcast ceramics have a lower binder content, and can be machined before "sintering". They also shrink isotropically when the binder is removed, allowing for more accurate mold construction. Gelcasting is described in U.S. Pat. No. 4,894,194, issued to Janney, and U.S. Pat. No. 5,028,362, issued to Janney et al. Briefly, the process is as follows. A ceramic powder is mixed with water or a nonaqueous solvent, a dispersant, and a monomer to form a slurry. A partial vacuum is applied to the slurry to remove air bubbles. Next, an initiator is added to the slurry, and then the slurry is cast into a mold. The mold and slurry are heated, which causes the initiator to begin polymerization of the monomer into a solvent-filled gel that supports the ceramic particles in the desired shape. This precursor stage of the finished part is called the "green" part. The green part is unmolded and dried to remove the solvent, which causes the part to shrink isotropically. A slurry that is about half solids produces a green part that will shrink by about 3%. Finally, the green part is sintered to burn off polymer and fuse the ceramic particles into a dense material.

The present invention creates molds that allow gelcasting to be used on microscopic and mesoscopic scales. Any type of gelcasting material may be used: ceramics, for example, alumina and silicon nitride; metals, such as stainless steels, tool steels, and superalloys; and castable polymers, including polyesters, epoxies, polyurethanes, and polyurethane foams. Castable polymers are not sintered. Gelcasting can also be used to form weak magnetic parts, in which the particles supported by the gel are magnetic. In this case, however, the green part is not sintered, and the polymer remains in the part to support the magnetic particles. For all gelcasting materials, solvents may be both aqueous and nonaqueous.

Figure 5A:
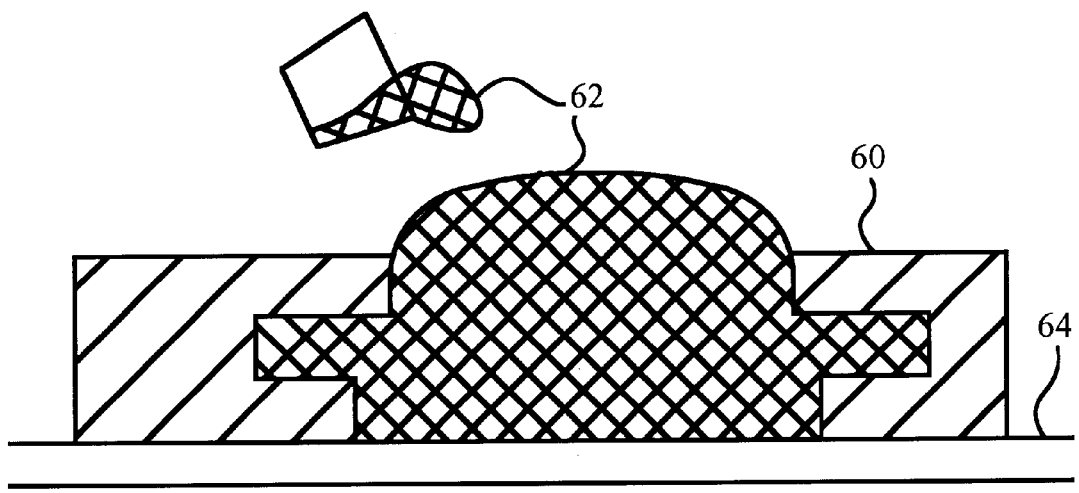
FIGS. 5A–5C show a mold being filled by a gelcasting material to produce a part.
Figure 5B:
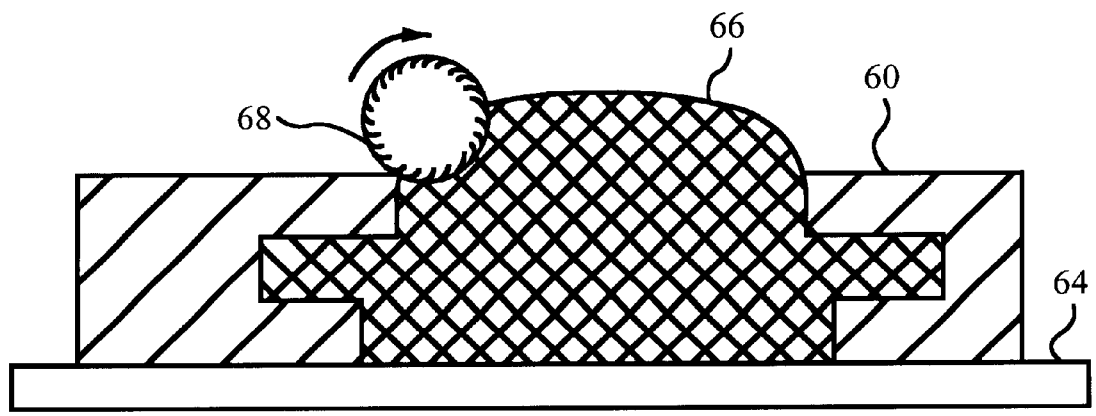
Figure 5C:
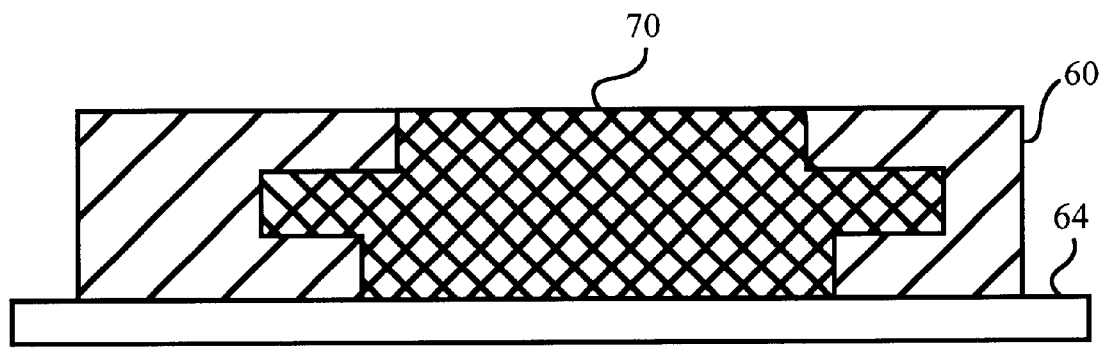
Figure 5D:
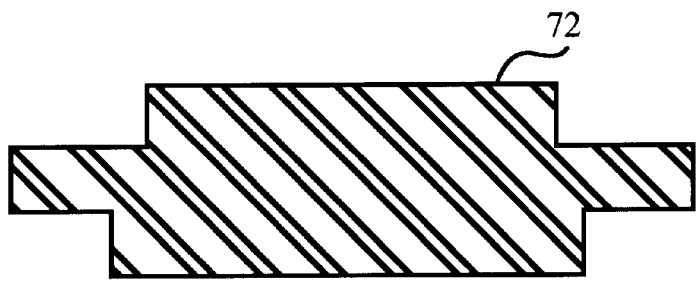

Microscopic gelcast parts can be made using either a layered silicon mold or a single patterned silicon wafer, acting as a silicon mold. FIGS. 5A–5D illustrate the gelcasting process using an "open" layered mold 60 made as described above. A gelcasting slurry 62 is poured into mold 60, which is supported on a support surface 64, for example, a flat aluminum plate. Alternately, the bottom layer of the mold may be an unetched wafer, or a patterned wafer that has not been through-etched. A partial vacuum may be imposed on the cast slurry to remove air bubbles; the rigid silicon mold resists deformation under vacuum. The slurry is cured, preferably by heating at 50–100° C. for approximately 1–2 hours, to form a hard gel or green part 66, shown in FIG. 5B. Any excess green part above the mold surface may be removed, in this case by grinding with a grinder 68. FIG. 5C shows the finished green part 70, a precursor to the final micropart. After the mold is removed (described below), the green part is sintered to produce the final micropart 72, shown in FIG. 5D. Suitable temperature profiles for sintering are well known in the art.

Figure 6:
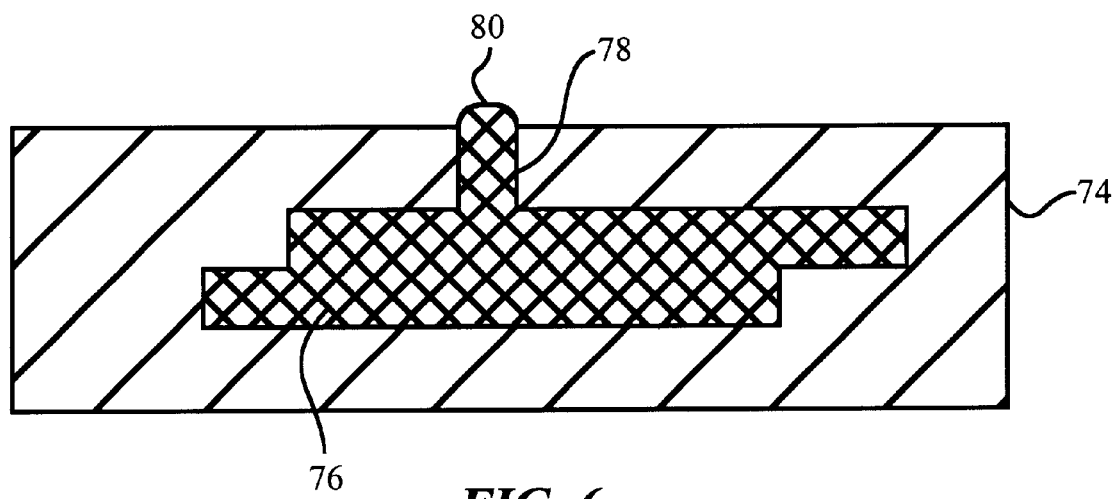
FIG. 6 is a cross-sectional view of a mold filled with a part precursor having a sprue.

Gelcast parts can also be formed in a "closed" mold 74, shown in FIG. 6. In this case, slurry 76 must be poured through sprue opening 78. After mold removal, the green part will have a sprue 80, which can then be removed by grinding.

Metal parts can also be formed by electroplating into the silicon mold. Any desirable metal that can be electroplated to sufficient quality may be used; common examples are copper and nickel. Preferably, the plated metal is copper. In most cases, the metal itself will be the desired part. However, the metal may also be used as an injection mold for plastic parts. As opposed to silicon molds, the metal mold can be reused.

Figure 7A:
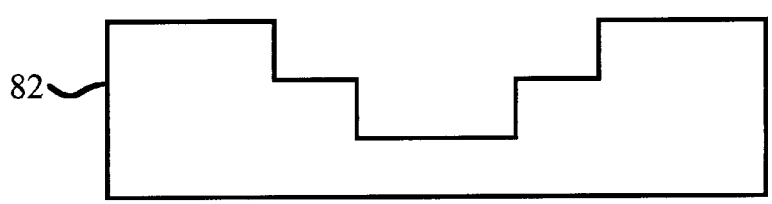
FIG. 7A is a cross-sectional view of a layered mold.
Figure 7B:
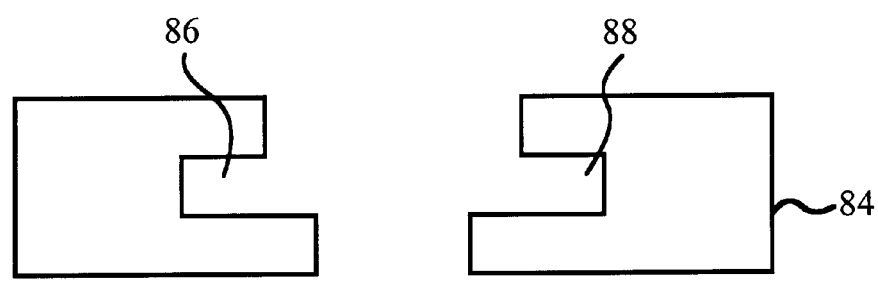
FIG. 7B is a cross-sectional view of a layered mold having overhangs.

In the case of mold 82 of FIG. 7A, the entire part can be electroplated at once. For mold 84 of FIG. 7B, regions 86 and 88 will not fill properly if the entire mold is created before electroplating; in this case, each layer is filled separately as described below. When the entire mold is filled at once, the resulting part is more likely to be free of defects. However, suitable parts may also be formed by sequentially filling layers.

Figure 8:
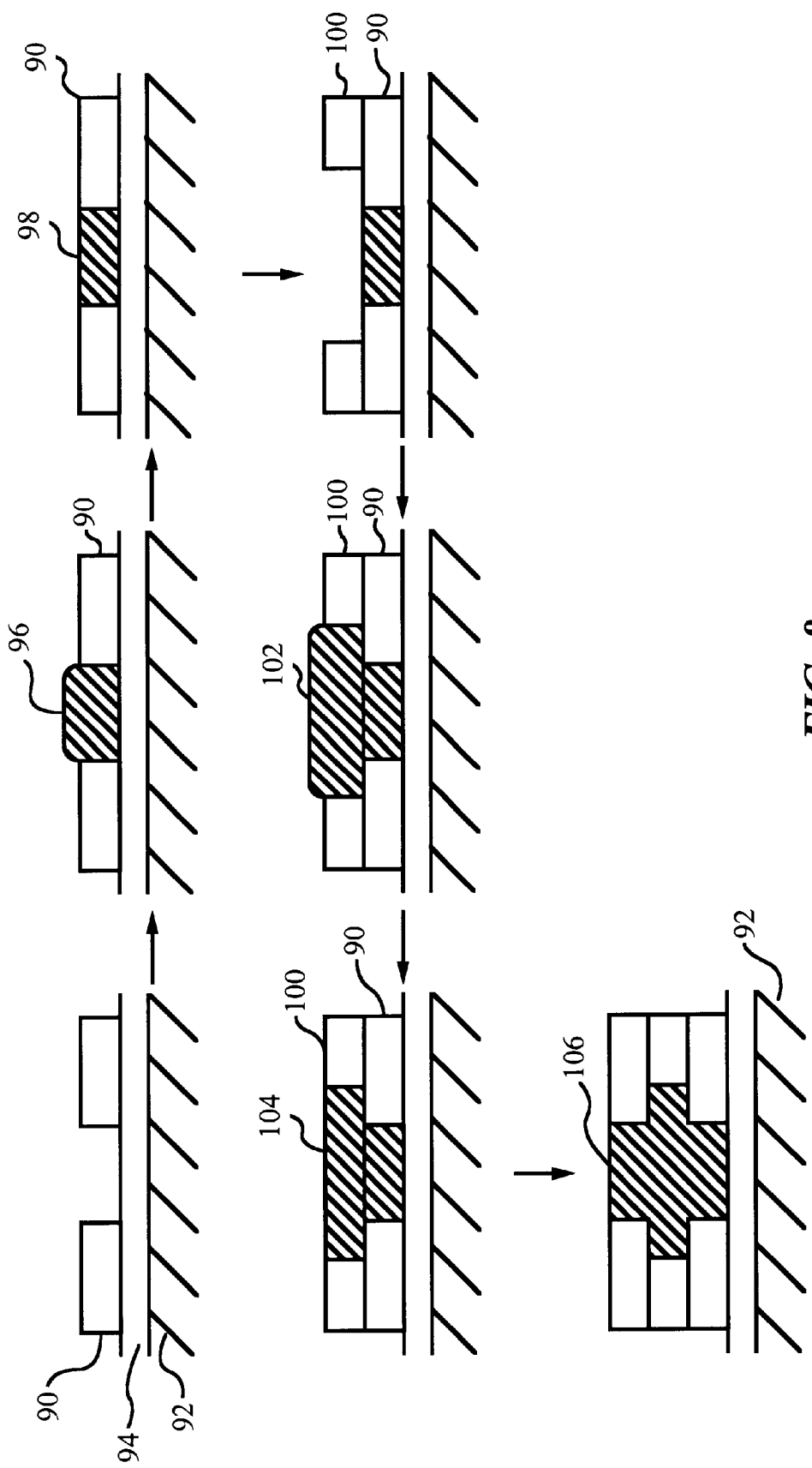
FIG. 8 is a schematic diagram of a process for creating a part by electroplating.

FIG. 8 illustrates the process of building a mold and electroplated part together. A first patterned silicon wafer layer 90 is mounted on a support 92 using a suitable adhesive. Support 92 may be made of a solid copper or aluminum plate with a thin metallic seed layer 94, which acts as an electroplating base. The electroplating base can be any metal suitable for electroplating the metal to be plated. Preferably, layer 94 has been sputtered to a thickness of less than 1 $\mu$m and is made of copper.

The assembly is immersed in an electroplating solution, which is preferably an acidic copper-sulfate solution. The solution may also contain a leveler and brightener, which are used to make the plating more uniform and to improve the surface finish of the copper being plated. Suitable quality parts may also be formed without the leveler and brightener. Electroplating is preferably done by periodic pulse reverse plating, the most efficient way of providing dense, nearly void-free copper having a smooth surface finish. Optimal current density is 30 mA/cm$^2$, which achieves a deposition rate of 25 $\mu$m/hr. The electroplating current is periodically reversed, with the reverse current being three times stronger than the forward current, but having a duration twenty times shorter. This technique is described in G. Milad, "Periodic Pulse Reverse," *Printed Circuit Fabrication,* Vol. 20, No. 7, July, 1997.

Layer 90 is plated with copper until a plated part 96 has the same height as or is slightly higher than layer 90. If necessary, the excess copper of part 96 can be ground off to reveal a level part 98. A next layer 100 is aligned with layer 90, using an optical microscope, mechanical alignment pins, or any other method. Layers 90 and 100 may be held together with any suitable wafer adhesive. Layer 100 is then plated with a metal 102, which is ground to form a level metal 104. The steps are repeated as necessary until all layers have been plated to form a part 106. If support 92 is aluminum, it may be removed after plating by a chemical etchant, for example, hydrochloric acid or potassium hydroxide.

Depending on the geometry of the mold, the silicon wafer layers may need to be coated with an electroplating base, preferably by sputtering. A thin layer of titanium or chromium, preferably 0.2 $\mu$m thick, forms an adhesion layer on the wafer. A thin copper layer is then sputtered, preferably to about 0.1 $\mu$m, on the adhesion layer.

Any method for filling the layered mold is within the scope of the present invention. For example, liquid phase sintering may also be used. For this technique, the mold is filled with a metal powder containing two metals having different melting temperatures. As the mold and powder are heated, the metal with the lower melting point melts to form a matrix that supports the grains of the second metal. After the part cools and solidifies, the mold can be removed. Hot pressing a metal powder mixture also produces suitable parts. In this case, the powder-filled mold may be pressed in a conventional 10-ton hot press in a graphite die, preferably at 750° C. and 30 MPa. For both methods, the metal mixture is preferably silver-tungsten, and particle diameters are preferably between 1 and 5 $\mu$m.

After the part or precursor is complete, the mold is removed, preferably by chemical etching. Any etchant that completely removes the mold, but does not attack or corrode the part itself, may be used. Gelcast green pieces still contain polymer, and are therefore especially susceptible to attack. Silicon is an excellent mold material, in part because it can be etched by a variety of chemicals, and so it is likely that a suitable etchant can be found that does not affect the part. In contrast, it would be difficult to remove a polymer mold from a green piece without attacking the polymer binder within the green piece itself.

The following four chemicals can etch silicon at a reasonable rate: potassium hydroxide (KOH), tetra-methyl ammonium hydroxide (TMAH), catechol (1,2-dihydroxybenzene), and a mixture of nitric acid (HNO$_3$), hydrofluoric acid (HF), and water (or acetic acid). The HF/HNO$_3$ mixture works at room temperature, and the other three at temperatures between 50° C. and 110° C. For copper parts, KOH is the most preferable etchant: it does not attack copper, etches {100} silicon at up to 100 $\mu$m/hour, and can be used without complicated safety precautions. Potassium degrades the high temperature properties of ceramics, and so KOH cannot be used for ceramics. Depending on the sensitivity of the polymeric binder in the green part to high temperatures, either TMAH or HF/HNO$_3$ can be used. After the mold material is removed, the part may require further finishing steps before being combined with other parts into an assembly. As described above, the gelcast green piece is sintered after mold removal.

An important advantage of the present invention is that it allows for a link between conventional macroscopic manufacturing techniques and micromachining. Macroscopic parts often have a few regions or features that either have microscopic dimensions or must be manufactured to an especially high precision. Using existing technologies, either the entire part must be made using micromachining techniques, or the microscopic feature must be made separately and then joined with the macroscopic part. These solutions are either too complicated or unnecessarily expensive. The present invention, $\mu$-Mold SDM, may be combined with conventional Mold Shape Deposition Manufacturing (Mold SDM) to produce a single mold containing both microscopic and macroscopic layers.

Mold SDM is a technique for producing complex, three-dimensional macroscopic parts from layered molds, usually made of wax. Sequential mold layers and support layers are built up, allowing for complicated undercut mold structures. The support material is eventually removed, and the resulting mold can be filled with part material.

Figure 9:
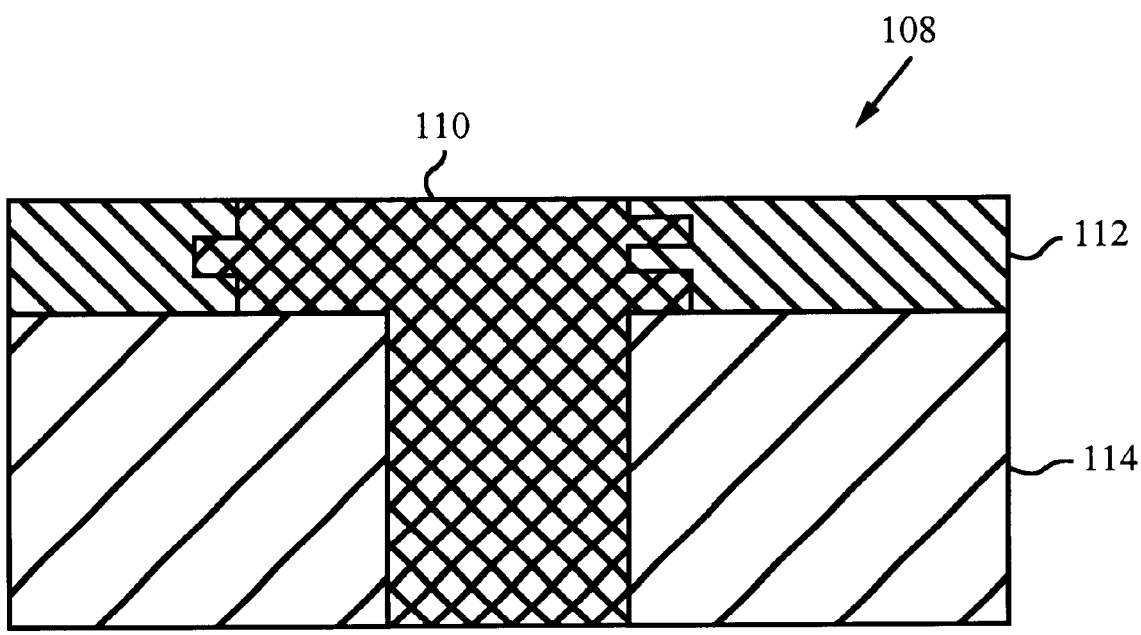
FIG. 9 is a cross-sectional view of a mold and part having macroscopic and microscopic regions.

As shown in FIG. 9, $\mu$-Mold SDM and Mold SDM can be combined to form a compound mold 108 filled with part material 110. Mold 108 contains silicon wafer layers 112 and wax layers 114. In general, the layers requiring high precision or small features are made from patterned silicon wafer layers, and the remaining layers from wax. Layers 112 and 114 of compound mold 108 can be joined together using a standard commercial adhesive. Using this method, there is virtually no limit in part size.

A CAD/CAM system can determine which layers to make of silicon and which of wax. It then sends layer information to the appropriate station within the system. μ-Mold SDM uses the layer information to generate photographic masks, and Mold SDM generates computer numerical control (CNC) code for material removal and deposition to form the wax layers.

Compound mold 108 can be filled with any of the part materials described above. After the finished part or green part is formed, depending on the technique, the wax mold is first dissolved in a heated solvent. The remaining silicon mold is then removed as described above.

It will be clear to one skilled in the art that the above embodiment may be altered in many ways without departing from the scope of the invention. For example, multiple part materials may be used within a single mold. Accordingly, the scope of the invention should be determined by the following claims and their legal equivalents.

What is claimed is:

1. A method of fabricating a precursor to a micropart, said method comprising the steps of:
   a) etching a silicon wafer to create a surface pattern in said silicon wafer and to produce a silicon mold;
   b) filling said mold with a gelcasting material; and
   c) solidifying said gelcasting material to produce said precursor.

2. The method of claim 1 wherein said surface pattern comprises a feature of width between 1 μm and 10 mm.

3. The method of claim 1, further comprising a step of removing said precursor from said mold.

4. The method of claim 3 wherein said step of removing said precursor comprises chemically etching said mold.

5. The method of claim 3, further comprising a step of sintering said precursor to produce said micropart.

6. The method of claim 1 wherein said gelcasting material comprises a ceramic gelcasting slurry.

7. The method of claim 1 wherein said gelcasting material comprises a metallic gelcasting slurry.

8. A method of fabricating a precursor to a part, said method comprising the steps of:
   a) etching silicon wafer layers to create surface patterns in said silicon wafer layers, wherein at least one of said silicon wafer layers comprises a through-etched region;
   b) creating a mold comprising said silicon wafer layers stacked together;
   c) filling said mold with a gelcasting material; and
   d) solidifying said gelcasting material to produce said precursor.

9. The method of claim 8, further comprising a step of removing said precursor from said mold.

10. The method of claim 9 wherein said step of removing said precursor comprises chemically etching said mold.

11. The method of claim 9, further comprising a step of sintering said precursor to produce said part.

12. The method of claim 8 wherein said mold further comprises a patterned wax layer having features of width greater than 1 mm.

13. The method of claim 8 wherein said gelcasting material comprises a ceramic gelcasting slurry.

14. The method of claim 8 wherein said gelcasting material comprises a metallic gelcasting slurry.

15. A method of fabricating a part, said method comprising the steps of:
   a) etching silicon wafer layers to create surface patterns in said silicon wafer layers, wherein at least one of said silicon wafer layers comprises a through-etched region;
   b) creating a mold comprising said silicon wafer layers stacked together; and
   c) filling each of said silicon wafer layers of said mold with a part material to produce said part.

16. The method of claim 15 wherein step (c) occurs after step (b).

17. The method of claim 15 wherein each of said silicon wafer layers is filled with said part material after being bonded to a previously filled layer of said silicon wafer layers.

18. The method of claim 15, further comprising a step of removing said part from said mold.

19. The method of claim 18 wherein said step of removing said part comprises chemically etching said mold.

20. The method of claim 15 wherein said mold further comprises a patterned wax layer having features of width greater than 1 mm.

21. The method of claim 15 wherein said part material comprises a polymer.

22. The method of claim 15, further comprising, between step (b) and step (c), a step of attaching said mold to a support surface.

23. The method of claim 22 wherein said support surface comprises a support metal, said part material comprises a metal, and step (c) comprises electroplating.

24. The method of claim 15, wherein said part material comprises a metallic powder and step (c) comprises liquid-phase sintering.

25. The method of claim 15, wherein said part material comprises a magnetic slurry and step (c) comprises solidifying said magnetic slurry to produce said part.

* * * * *